United States Patent [19]
Hayashi et al.

[11] Patent Number: 5,232,868
[45] Date of Patent: Aug. 3, 1993

[54] METHOD FOR FORMING A THIN SEMICONDUCTOR FILM

[75] Inventors: Yutaka Hayashi, Umezono; Mitsuyuki Yamanaka, Matsushiro, both of Japan

[73] Assignee: Agency of Industrial Science and Technology, Tokyo, Japan

[21] Appl. No.: 742,101

[22] Filed: Aug. 5, 1991

Related U.S. Application Data

[63] Continuation of Ser. No. 410,854, Sep. 22, 1989, abandoned.

[30] Foreign Application Priority Data

Oct. 4, 1988 [JP] Japan .................................. 63-250341

[51] Int. Cl.⁵ .......................................... H01L 21/203
[52] U.S. Cl. ...................................... 437/131; 437/86; 437/101; 437/106; 437/949; 437/969; 437/971; 148/DIG. 51; 148/DIG. 109; 156/610; 427/255.1
[58] Field of Search ................. 437/86, 101, 106, 131, 437/233, 949, 969, 971; 148/DIG. 1, DIG. 14, DIG. 51, DIG. 109; 156/610, 613, 614; 204/193.12; 427/38.39, 531.1, 54.1, 248.1, 252, 253, 253.1

[56] References Cited

U.S. PATENT DOCUMENTS

| 4,716,048 | 12/1987 | Ishihara et al. | 427/53.1 |
| 4,726,963 | 2/1988 | Ishihara et al. | 437/39 |
| 4,808,553 | 2/1989 | Yamazaki | 437/100 |
| 4,818,563 | 4/1989 | Ishihara et al. | 437/225 |
| 5,011,759 | 4/1991 | Hitotsuyanagi | 430/128 |

FOREIGN PATENT DOCUMENTS

2579825 10/1986 France .

Primary Examiner—Robert Kunemund
Attorney, Agent, or Firm—Oliff & Berridge

[57] ABSTRACT

A method for forming a thin semiconductor film comprises the steps of supplying on a surface of a heated substrate a first material gas composed of germanium halide or germanium hydro-fluoride obtained by partially substituting fluorine of the germanium fluoride together with a second material gas composed of silicon hydride or silicon fluoro-hydride obtained by partially substituting hydrogen of the silicon hydride with fluorine and causing a chemical reaction between the first and second material gases, thereby growing a thin film containing germanium over the surface of the substrate. By controlling the substrate temperature or flow rate ratio of the first material gas to the second material gas, an optical gap of the thin film grown can be controlled.

13 Claims, 4 Drawing Sheets

METHOD FOR FORMING A THIN SEMICONDUCTOR FILM

This is a continuation of application Ser. No. 07/410,854 filed Sep. 22, 1989, now abandoned.

BACKGROUND OF THE INVENTION

1. Field of the Invention

The present invention relates to a method for forming a thin semiconductor film to be used for electronic or optical elements and more particularly a method for forming a thin semiconductor film with a controlled optical gap.

2. Description of the Prior Art

The thin films for electronic elements which have been formed by the thin film growing techniques such as the plasma chemical vapor deposition (plasma CVD) which mainly utilize energies except thermal energy has the problem that when the formed thin films are used in, for instance, optoelectronic transducers, the remarkable photo-induced degradation of their optoelectronic characteristics. On the other hand, in the case of thin films formed by thin film fabrication techniques which mainly utilize the thermal energy, such as the thermal CVD, their photo-induced degradation can be reduced to a minimum and the film can be grown in relatively uniform thickness over the irregularly shaped surface of a substrate.

Meanwhile it is well known to those skilled in the art that when the thin films for optoelectronic transducers such as amorphous silicon solar cells are fabricated by the thermal decomposition of silane compounds such as monosilane, disilane and so on, the thin films and elements with less optical degradation can be obtained. However, during the growth of a thin film the temperature of a substrate must be maintained at the order of about 500° C. in practice. As a result, kinds of substrates used in thermal CVD are limited. Furthermore, the thin film quality is not satisfactory for the fabrication of the optoelectronic transducers so that the demand for improving the thin film quality is increased. So far it has been difficult to adjust an optical gap of thin films less than 1.6 ev.

SUMMARY OF THE INVENTION

In view of the above, an object of the present invention is to provide a method for forming thin semiconductor films which can substantially solve the above and other problems, can grow a thin semiconductor film at a low temperature and can control the optical gap of the thin semiconductor films.

The present invention provides a method for forming a thin semiconductor film comprising the steps of:

supplying over the surface of a heated substrate, a first material gas composed of germanium fluoride or a germanium hydro-fluoride obtained by partially substituting fluorine of the germanium fluoride with hydrogen together with a second material gas composed of a silicon hydride or a silicon fluoro-hydride obtained by partially substituting hydrogen of the silicon hydride with fluorine;

and causing a thermochemical reaction between the first and second material gases, thereby growing a thin film containing germanium on the surface of the substrate.

Here, a temperature of the substrate may be lower than the respective decomposition temperatures of the first and second material gases.

The first material gas may be a gas of $GeF_4$.
The first material gas may be a gas of $Ge_2F_6$.
The second material gas may be a gas of $Si_2H_6$.
The second material gas may be a gas of $SiH_4$.
The second material gas may be a gas of $Si_3H_8$.
The second material gas may be a gas of $Si_2H_4F_2$.

The temperature of the substrate may be controlled so as to control the optical gap of the thin semiconductor film.

The optical gap of the thin film may be controlled by controlling a flow rate ratio between the first and second materials gases.

The above and other objects, effects, features and advantages of the present invention will become more apparent from the following description of embodiments thereof taken in conjunction with the accompanying drawings.

DETAILED DESCRIPTION OF PREFERRED EMBODIMENTS

The inventors made extensive studies and experiments of the techniques such as thermal CVD or the like mainly utilizing the thermal energy for forming thin semiconductor films and found out the following facts. That is, a material gas composed of a mixture of a silicon hydride or silicon fluoro-hydride (a compound obtained by substituting a part of hydrogen of silicon hydride with fluorine) and a germanium fluoride or germanium hydro-fluoride (a compound obtained by substituting a part of fluorine of germanium fluoride with hydrogen) is supplied on the surface of a heated substrate and then a thin semiconductor film can be formed at a temperature lower than that at which a film is grown from silicon hydride or silicon fluoro-hydride and than that at which a film is grown from germanium fluoride or germanium hydro-fluoride. Furthermore the same inventors confirmed the fact that when a material gas composed of the above-mentioned compounds is used within a temperature range, in which range the thin-film growth rate is determined by temperature, a thin film growth rate higher than that when only a silane-series compound or a germanium fluoride compound is used as a material gas for growing a thin film. Moreover the same inventors found out the fact that the optical gap of a thin film can be varied by varying the mixing ratio of the above-mentioned compounds or varying the temperature of substrate upon which is grown a thin film even when the mixing ratio remains unchanged. Thus the present invention was made based upon the above-described facts and provides a method for forming thin semiconductor films each having a high quality and a controlled optical gap upon substrates maintained relatively low temperatures.

Figure 1:
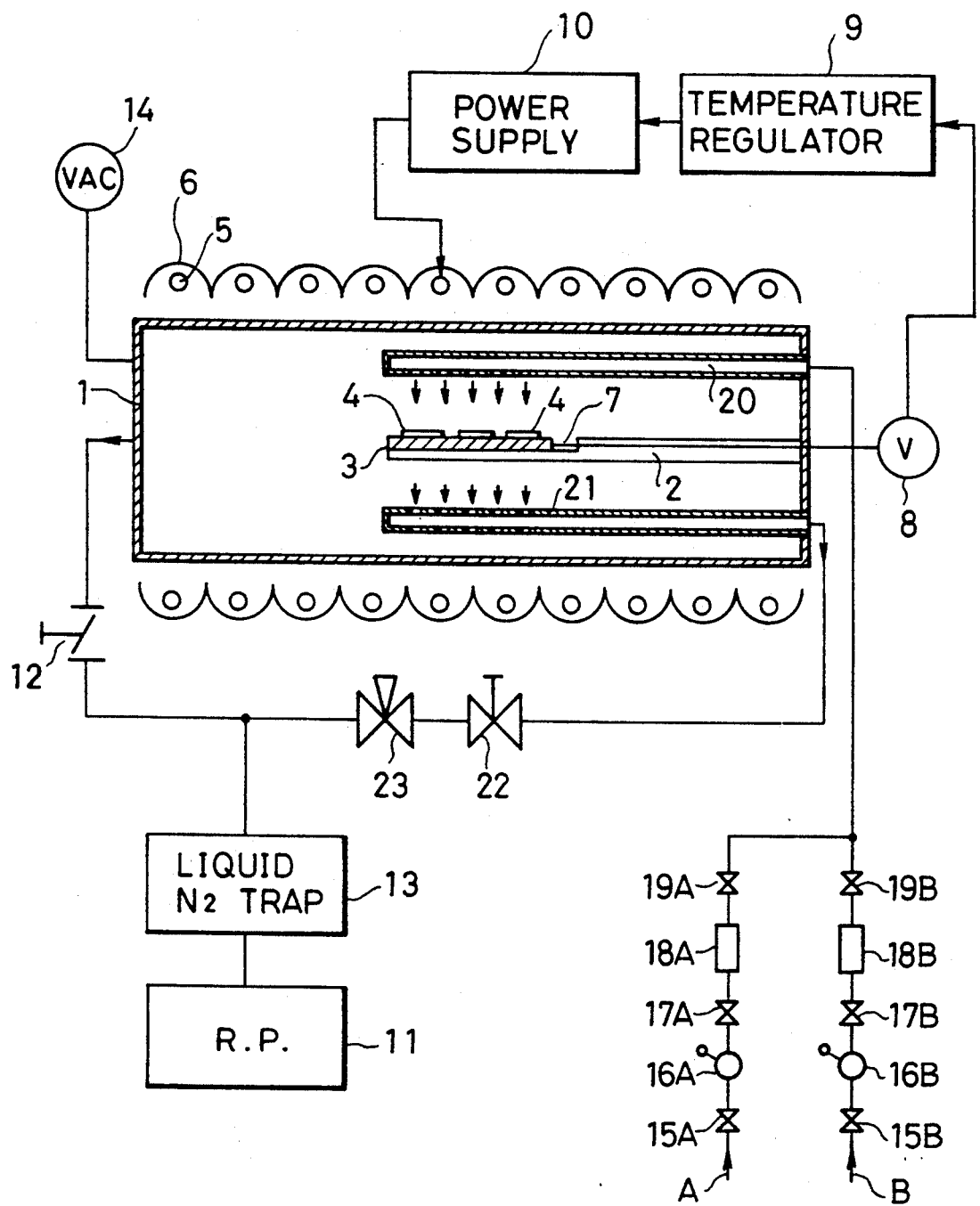
FIG. 1 is a schematic view illustrating an apparatus to which is applied a method for forming thin semiconductor films in accordance with the present invention.

In order to grow a thin film, a lamp heating furnace of the type as shown in FIG. 1 was used. A carbon suscepter 3 coated with SiC is placed on a substrate supporting holder 2 within a quartz (reaction) chamber 1 and substrates 4 are placed on the carbon suscepter 3. A heat radiation heating apparatus comprising white-light-emitting lamps 5 each provided with a mirror 6 is disposed around the outer surface of the quartz chamber 1 to heat suscepter 3, which in turn heats the substrates 4. The temperature of each substrate 4 is measured by a thermocouple 7 or a pyrometer 8 and controlled by controlling a lamp power supply 10 with a temperature regulator 9 so that the substrates 4 can be maintained at a predetermined temperature.

The air or gases within the quartz chamber 1 is evacuated by a vacuum pump such as a rotary pump 11 through a solenoid-controlled valve 12 and a liquid nitrogen trap 13. After confirming that the interior of the quartz chamber 1 has reached a predetermined degree of vacuum by a vacuum indicator 14, the substrates 4 are heated to a predetermined temperature. When the substrates 4 are heated to a predetermined temperature, the solenoid-control valve 12 is closed.

A germanium fluoride gas or a germanium hydrofluoride gas is fed from a pipe line A and through a valve 15A, a pressure governer 16A, a valve 17A, a flow rate controller 18A and a valve 19A, while a silicon hydride gas or a silicone fluoro-hydride gas is fed from a pipe line B and through a valve 15B, a pressure governer 16B, a valve 17B, a flow rate controller 18B and a valve 19B. Thus, both gases are mixed and are supplied on the surfaces of the sustrates 4 through a material feed pipe 20. The reaction of the material gases thus fed into the quartz chamber 1 occurs over the heated substrates 4. More particularly, a germanium fluoride or a compound obtained by substituting a part of fluorine of the germanium fluoride with hydrogen is reduced by a silane-series gas. As a consequence, a thin semiconductor film substantially consisting of germanium or a thin semiconductor film containing germanium and silicon is formed on the substrates after the reaction, hydrogen gas and fluorine gas, which are produced by the decomposition of the material gases, and the gases which do not undergo the chemical reaction are discharged through a discharge line 21, a valve 22 and a pressure control valve 23 and the pressure in the reaction chamber is maintained at a predetermined level.

The use of the lamp heating furnace is advantageous in that heating of quartz tube walls is less so that a thin film is substantially deposited on each substrate. However, the present invention is not limited only to the above-mentioned lamp heating furnace and it may use a resistance heater or a high-frequency furnace which heats substrates by high-frequency induction heating.

Next the embodiment in which GeF$_4$ is used, which is the simplest example of germanium fluorides, will be described. A quartz substrate is used to make an optical measurement of a thin film that is, a film thickness and an optical gap E$_{GOPT}$. A silicon crystal substrate is used for an infrared absorption measurement to measure the amount of combined hydrogen and for an Auger spectrochemical analysis to analyze a composition ratio between germanium and silicon. Furthermore, various substrates such as glass substrates, stainless steel substrates and so on which are stable to some extent at a film growth temperature may be used.

Figure 2:
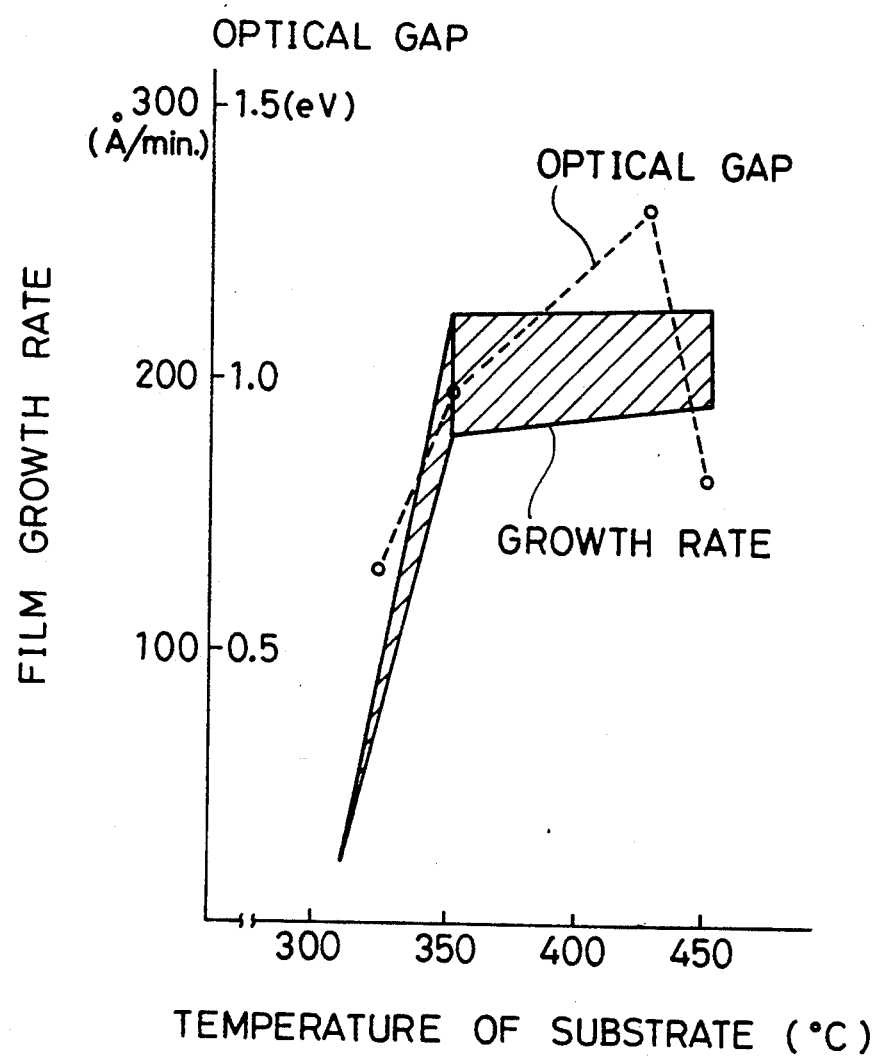
FIGS. 2 and 3 illustrate characteristic diagrams indicating the dependence of a thin film growth rate and an optical gap upon the temperature of a substrate.

FIG. 2 illustrates the dependence of the growth rates of thin films and the optical gap on the substrate temperature when disilane Si$_2$H$_6$ and GeF$_4$ were mixed substantially at the same ratio and a thin film was grown with the pressure within the reaction chamber being maintained at 100 Torr. It is seen that the growth of a thin film at 325° C., which is considerably lower than 500° C., and the higher the temperature, the higher the growth rate, and also it has been confirmed that, the growth rate becomes substantially constant in excess of 350° C. under the experimental conditions of this embodiment. The optical gap is 0.7 ev at the thin film formation temperature of 325° C., but it increases with the increase in thin film formation temperature and reaches 1.35 ev at the thin film formation temperature of 425° C.

When the ratio between GeF$_4$ and disilane is varied, the thin film growth rate or optical gap may be varied. Furthermore when the pressure in the reaction chamber is varied, the growth rate can be varied. It was confirmed by the infrared absorption measurement that almost all of the thin films grown in the manner described above are an amorphous state and in which the unbounded bonds are terminated by the hydrogen. The thin film grown at a temperature between 325° and 350° C. almost consists of Ge and the composition of silicon was less than 2%. The thin films grown at high temperatures (higher than 400° C.) contain more silicon. For instance, the Auger spectrochemical analysis showed that the silicon content in the thin films grown at 425° C. is 34%.

In the case of the conventional amorphous silicon films, when the reaction temperature is high, the optical gap E$_{GOPT}$ drops. In this sense, FIG. 2 presents a remarkable contrast compared with the conventional thin amorphous films.

It was found out that when only GeF$_4$ was used, no reaction occurred at 475° C. Only when disilane was used, the thin film growth rate was remarkably slow at temperatures lower than 450° C. as compared with the case of the present invention in which disilane was mixed with GeF$_4$, and no film growth was observed from disilane at temperatures lower than 400° C.

Figure 3:
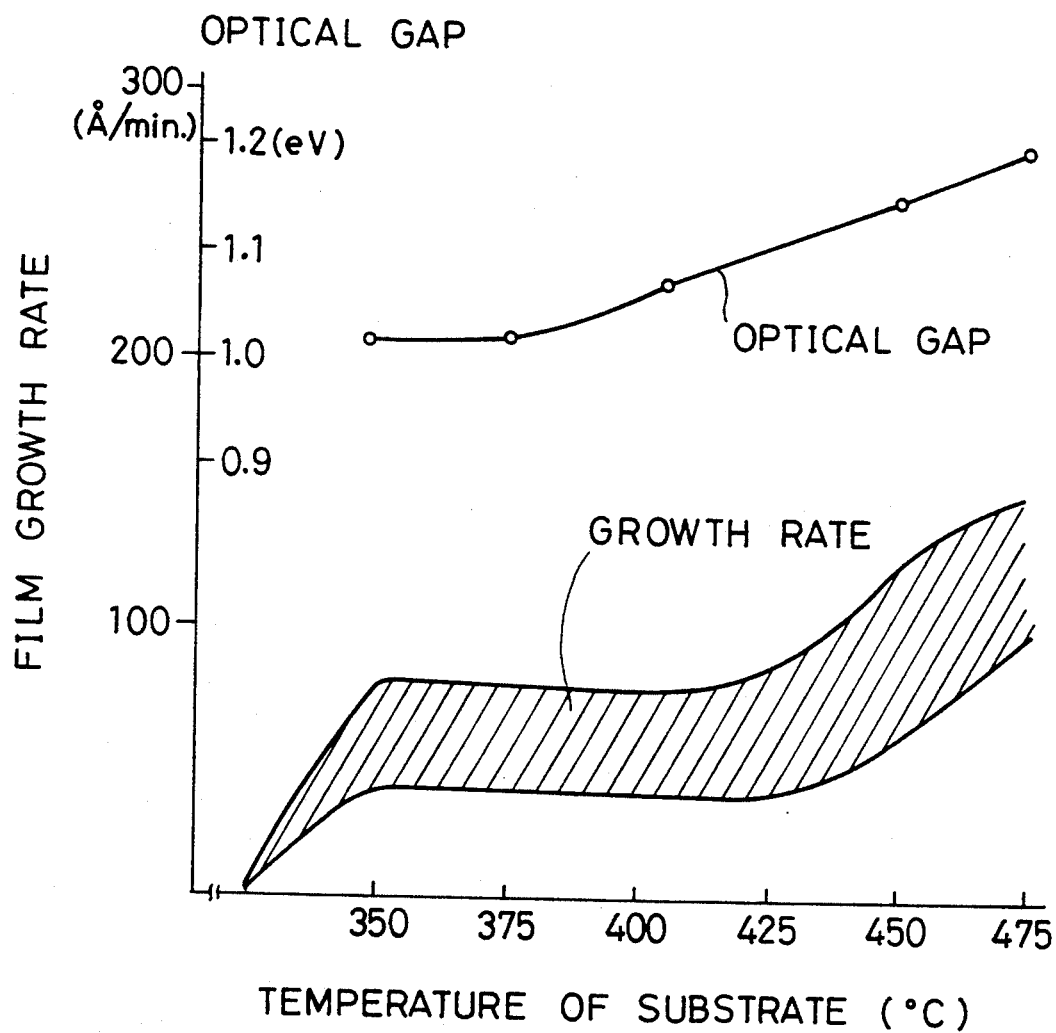

FIG. 3 illustrates the dependence of the growth rate and the optical gap of the deposited film upon the film growth temperature when the thin films were grown from a material consisting of GeF$_4$ and Si$_2$H$_6$ mixed at the same ratio and when the pressure within the reaction chamber was maintained at 10 Torr. The growth of a thin film is not almost observed at the thin film growth temperature 325° C., but at 350° C. the growth rate of 70–80 Å min can be attained. At temperatures in excess of 350° C., the increase in growth rate is not observed, but at temperatures in excess of 450° C., the growth rate is increased again.

The optical gap is increased at temperatures higher than 400° C. This embodiment also shows that, unlike the prior art in which film was grown from a starting material consisting only of Si$_2$H$_6$, the optical gap is increased with the increase in film growth temperature. Furthermore this embodiment shows a reversed tendency as compared with the conventional amorphous silicon films grown by the thermal CVD process.

Figure 4:
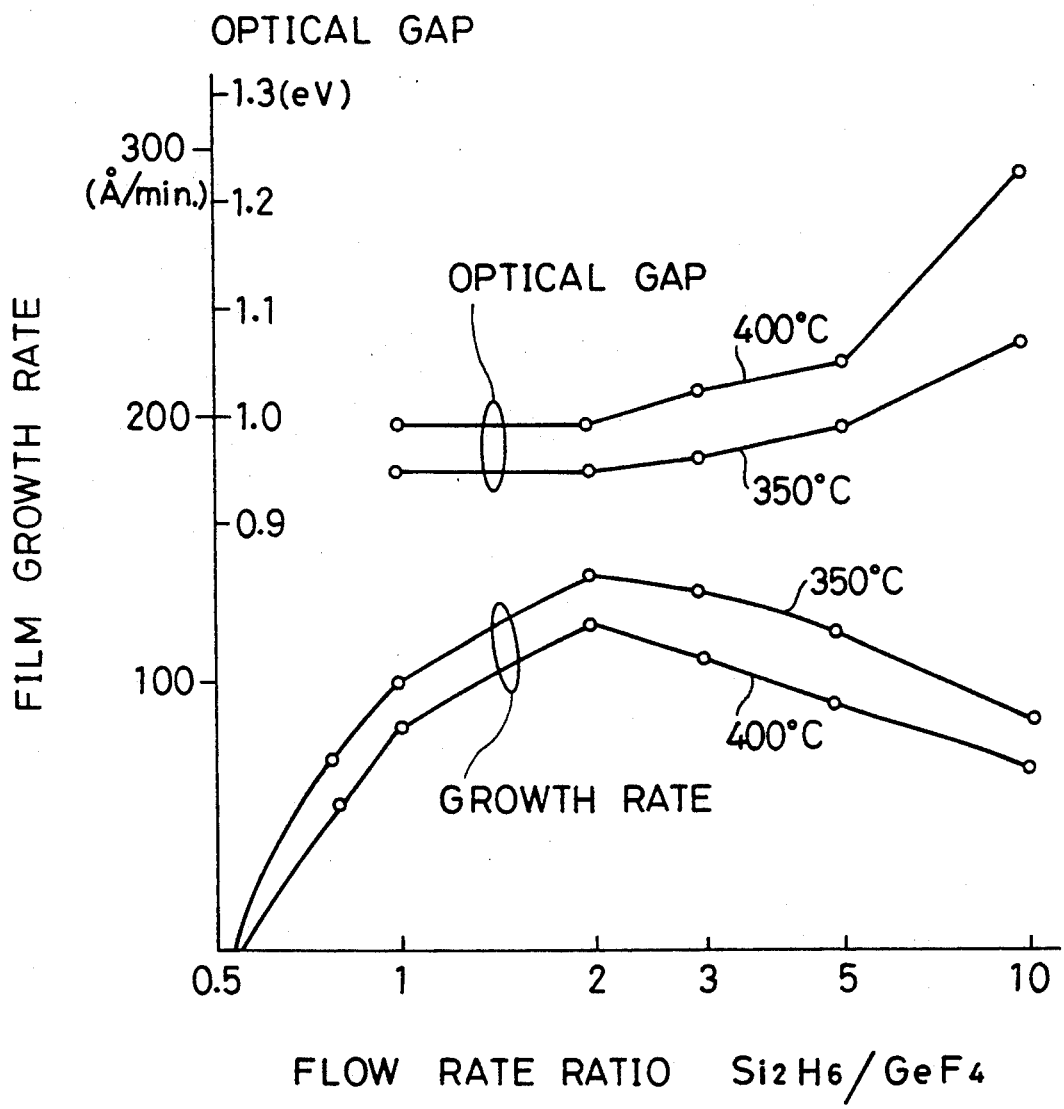
FIG. 4 is a characteristic diagram illustrating the dependence of a thin film growth rate and an optical gap upon the flow rate ratio of $Si_2H_6$ to $GeF_4$.

FIG. 4 shows the dependence of the growth rate and the optical gap of the grown thin films upon the thin film growth temperature when the flow rates of Si$_2$H$_6$ and GeF$_4$ were varied. As the case shown in FIG. 3, the pressure in the reaction chamber was controlled at 10

Torr. Furthermore, in order to reduce variations in film growth due to the difference in position between substrates, argon was made to flow as an inert carrier gas. It is seen that the growth rate becomes a maximum level when the flow rate ratio of $Si_2H_6$ to $GeF_4$ is around 2. When the flow rate ratio is 0.5, the growth rate is remarkably decreased. The optical gap of the thin film grown at 400° C. is greater than that of the thin film grown at 350° C., but the optical gap is increased with the increase of the flow rate ratio. In case of the thin films grown at 400° C. is increased from about 1.0 ev. to 1.2 ev.

Almost all the thin films obtained by the above-described embodiments were amorphous as described above, but in some cases the thin films grown at low growth rates, fine crystallization was observed.

As described above, according to a method for forming thin films of the present invention, the thin films can be grown at a temperature lower than the temperature at which a film is grown from conventional silane-series compounds and lower than the temperatures at which thin films were grown when only germanium fluoride or compounds obtained by substituting a part of fluorine of germanium fluoride by hydrogen are used as a raw material gas. Furthermore, the optical gap of a thin film grown can be controlled within an optical gap region, which is narrower than the conventional optical gap, by varying the above-mentioned flow rate ratio between a germanium-fluoride compound and a silane-series compound or controlling a growth temperature.

In the above-described embodiments, $GeF_4$ was used as one example of germanium fluoride series compounds, but when $GeHF_3$ or $Ge_2F_6$ is used, the thin film growth temperature range shifts to a low temperature side. When $SiH_4$ or $Si_2H_4F_2$ is used, the growth temperature slightly shifts to a high temperature side. The thin film is grown at 400°–425° C. when $SiH_4$ is used together with germanium fluoride under a near atmospheric pressure. When $Si_3H_8$ is used, its growth temperature slightly shifts to a lower temperature side of the growth temperature than that of $Si_2H_6$ and the film is formed at 300° C.

According to the present invention, germanium fluorides such as $GeF_4$, $Ge_2F_6$ and the like or germanium compounds obtained by substituting part of fluorine of a germanium fluoride with hydrogen are reduced by silicon hydride or compounds obtained by substituting a part of hydrogen of silicon hydride with fluorine to form a thin film. When the reaction temperature is low (lower than about 350° C. in the cases of $GeF_4$ and $Si_2H_6$), it becomes difficult for silicon to be involved into the thin film so that the optical gap $E_{GOPT}$ is low, but when the reaction temperature is high, silicon is partially contained in a thin film so that the optical gap $E_{GOPT}$ becomes high.

As described above, according to the present invention, a germanium fluoride or a compound obtained by substituting a part of fluoride thereof by hydrogen is reduced by a silicon hydride or a silane series compound obtained by partially substituting hydrogen of the silicon hydride by fluoride, whereby a thin film containing Ge is grown on a substrate so that a thin semiconductor film having a high quality and a controlled optical gap can be grown on the substrate at a low temperature.

The present invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed:

1. A method for forming a thin semiconductor film comprising the steps of:

supplying over a surface of a heated substrate a first material gas composed of germanium fluoride or a germanium hydrofluoride obtained by partially substituting fluorine of said germanium fluoride with hydrogen together with a second material gas composed of a silicon hydride or a silicon fluorohydride obtained by partially substituting hydrogen of said silicon hydride with fluorine, said first and second material gases being supplied over a said heated substrate in a non-decomposed state, wherein said heated substrate is at a temperature at which said first material gas makes a thermochemical reaction with said second material gas; and causing a thermochemical reaction between said first and second material gases at said surface of said substrate, thereby growing a thin film containing germanium on said surface of said substrate.

2. A method for forming a thin semiconductor film as claimed in claim 1, wherein a temperature of said substrate is lower than the respective decomposition temperatures of said first and second material gases.

3. A method for forming a thin semiconductor film as claimed in claim 1, wherein said first material gas is a gas of $GeF_4$.

4. A method for forming a thin semiconductor film as claimed in claim 1, wherein said first material gas is a gas of $Ge_2F_6$.

5. A method for forming a thin semiconductor film as claimed in claim 1, wherein said second material gas is a gas of $Si_2H_6$.

6. A method for forming a thin semiconductor film as claimed in claim 1, wherein said second material gas is a gas of $SiH_4$.

7. A method for forming a thin semiconductor film as claimed in claim 1, wherein said second material gas is a gas of $Si_3H_8$.

8. A method for forming a thin semiconductor film as claimed in claim 1, wherein said second material gas is a gas of $Si_2H_4F_2$.

9. A method for forming a thin semiconductor film as claimed in claim 1, wherein said temperature of said substrate is controlled so as to control the optical gap of said thin semiconductor film.

10. A method for forming a thin semiconductor film as claimed in claim 1, wherein said optical gap of said thin film is controlled by controlling a flow rate ratio between said first and second materials gases.

11. A method for forming a thin semiconductor film as claimed in claim 1, wherein said substrate is heated with heating lamps.

12. A method for forming a thin semiconductor film as claimed in claim 1, wherein said first and second gases are decomposed on said substrate and react with each other to form said thin film on said substrate.

13. A method of claim 1 wherein said heated substrate is heated to a temperature of not less than 325° C.

* * * * *